US008043469B2

(12) United States Patent
Nakamori et al.

(10) Patent No.: US 8,043,469 B2
(45) Date of Patent: Oct. 25, 2011

(54) SUBSTRATE PROCESSING METHOD, SUBSTRATE PROCESSING APPARATUS, AND STORAGE MEDIUM

(75) Inventors: Mitsunori Nakamori, Nirasaki (JP); Yusuke Saito, Nirasaki (JP); Akira Ishihara, Koshi (JP); Satoru Tanaka, Koshi (JP); Yuji Murakami, Koshi (JP)

(73) Assignee: Tokyo Electron Limited, Tokyo-To (JP)

( * ) Notice: Subject to any disclaimer, the term of this patent is extended or adjusted under 35 U.S.C. 154(b) by 874 days.

(21) Appl. No.: 11/905,859

(22) Filed: Oct. 4, 2007

(65) Prior Publication Data

US 2008/0093340 A1 Apr. 24, 2008

(30) Foreign Application Priority Data

Oct. 6, 2006 (JP) ................................. 2006-275018
Aug. 22, 2007 (JP) ................................. 2007-215753

(51) Int. Cl.
*H01L 21/304* (2006.01)
(52) U.S. Cl. ............................... 156/345.21; 156/345.33
(58) Field of Classification Search ............. 156/345.21, 156/345.33
See application file for complete search history.

(56) References Cited

U.S. PATENT DOCUMENTS

| 5,882,433 | A | 3/1999 | Ueno |
| 5,882,466 | A | 3/1999 | Grootaert et al. |
| 6,004,047 | A | 12/1999 | Akimoto et al. |
| 6,092,937 | A | 7/2000 | Snodgrass et al. |
| 6,247,479 | B1 | 6/2001 | Taniyama et al. |
| 6,333,275 | B1 | 12/2001 | Mayer et al. |
| 6,415,803 | B1 | 7/2002 | Sundin et al. |
| 6,491,764 | B2 | 12/2002 | Mertens et al. |
| 6,834,440 | B2 | 12/2004 | Lee |
| 6,863,741 | B2 | 3/2005 | Orii et al. |
| 6,938,626 | B2 * | 9/2005 | Inagaki ....................... 134/56 R |
| 7,543,593 | B2 | 6/2009 | Orii et al. |
| 7,806,989 | B2 | 10/2010 | Sekiguchi et al. |
| 2001/0004878 | A1 | 6/2001 | Sakai et al. |
| 2002/0007844 | A1 | 1/2002 | Orii et al. |
| 2005/0115671 | A1 | 6/2005 | Araki |

(Continued)

FOREIGN PATENT DOCUMENTS

DE 11 2007 000442 2/2009

(Continued)

OTHER PUBLICATIONS

Machine Generated English Translation of the Abstract of WP 2006/041077 published Apr. 20, 2006.*

(Continued)

*Primary Examiner* — Sylvia R. MacArthur
(74) *Attorney, Agent, or Firm* — Smith, Gambrell & Russell, LLP

(57) ABSTRACT

At first, with a chamber being filled with a first gas, a process liquid is supplied onto a surface of a wafer in the chamber so as to process the surface of the wafer. At this time, the process liquid discharged from the chamber is returned to a process-liquid supplying part. Thereafter, with the chamber being filled with a second gas whose humidity is lower than that of the first gas, a fluid for forming a liquid film is supplied onto the surface of the wafer in the chamber to form a liquid film on the surface of the wafer and to dry the surface of the wafer.

1 Claim, 5 Drawing Sheets

U.S. PATENT DOCUMENTS

| | | | |
|---|---|---|---|
| 2007/0131256 A1 | 6/2007 | Nanba et al. | |
| 2007/0223342 A1 | 9/2007 | Orii et al. | |
| 2008/0093340 A1 | 4/2008 | Nakamori et al. | |
| 2009/0014033 A1* | 1/2009 | Tokuno et al. | 134/18 |

FOREIGN PATENT DOCUMENTS

| | | |
|---|---|---|
| EP | 1 801 860 | 6/2007 |
| JP | 02-046728 | 2/1990 |
| JP | 04-179227 | 6/1992 |
| JP | 6-9130 U | 2/1994 |
| JP | 9-22891 | 1/1997 |
| JP | 9-038595 | 2/1997 |
| JP | 09-069488 | 3/1997 |
| JP | 9-293702 | 11/1997 |
| JP | 11-233481 | 8/1999 |
| JP | 2000-058498 | 2/2000 |
| JP | 2001-053051 | 2/2001 |
| JP | 2002-057088 | 2/2002 |
| JP | 2002-110612 | 4/2002 |
| JP | 2003-197590 | 7/2003 |
| JP | 2003-229404 | 8/2003 |
| JP | 2005-159191 | 6/2005 |
| JP | 2006-269668 | 10/2006 |
| WO | WO 03/007348 | 1/2003 |
| WO | WO 2005/050724 | 6/2005 |
| WO | 2006/041077 | 4/2006 |
| WO | WO2006041077 A * | 4/2006 |

OTHER PUBLICATIONS

Notification of Reasons for Rejection of Japanese Application No. 2006-540941, mailed Jan. 23, 2009.

Supplementary European Search Report for Application No. EP 05 79 3595 issued Jul. 14, 2009.

International Search Report (PCT/ISA/210) in PCT/JP2006/306534, dated Jun. 27, 2006.

PCT Notification of Transmittal of Translation of the International Preliminary Examination Report (Form PCT/IB/338), for PCT/JP2005/018770, dated Apr. 26, 2007.

PCT International Preliminary Report on Patentability (Form PCT/IB/373) in PCT/JP2005/018770, with English Translation, dated Apr. 17, 2007.

Machine Generated Translation of JP 2002-057088, figure 1, published Feb. 22, 2002.

Japanese Office Action issued on May 14, 2009 for Japanese Patent Application No. 2005-380090 with English translation.

Japanese Office Action issued on Jan. 19, 2010 for Japanese Patent Application No. 2005-380090 with English translation.

PCT Second and Supplementary Notice Informing Applicant of Communication of International Application (Form PCT/IB/308) in PCT/JP05/018770, dated Feb. 15, 2007.

Notification of Transmittal of Translation of the International Preliminary Report on Patentability (Form PCT/IB/338) in PCT/JP2005/018770, dated Apr. 26, 2007.

PCT Written Opinion of the International Searching Authority (Form/ISA/237), for PCT/JP2005/018770, with English translation, dated Jan. 10, 2006.

Office Action for U.S. Appl. No. 11/578,099, dated Oct. 19, 2010.

Japanese Office Action issued on Jul. 15, 2011 for Application No. 2007-215753 w/ English language translation.

* cited by examiner

SUBSTRATE PROCESSING METHOD, SUBSTRATE PROCESSING APPARATUS, AND STORAGE MEDIUM

FIELD OF THE INVENTION

The present invention relates to a substrate processing method, a substrate processing apparatus, and a storage medium, which are for subjecting a substrate to be processed, to a process with a process liquid and a drying process.

BACKGROUND ART

In a manufacturing process of a semiconductor device or the like, a surface of a semiconductor wafer (hereinafter referred to as "wafer") is subjected to a process with the use of a process liquid, such as an etching process and a polymer removal process, and then the surface is subjected to a drying process (see, JP6-9130U, for example).

As an example of processing a wafer with a process liquid, an etching process is described below.

Specifically, an etching liquid such as a hydrofluoric acid solution (HF liquid) is supplied onto a surface of a wafer placed in a chamber of a substrate processing apparatus to conduct an etching process such as a dilute hydrofluoric cleaning and a buffered hydrofluoric acid cleaning, and then a rinse liquid such as a deionized water is supplied onto the surface of the wafer to clean the same. As an etching liquid, there may used a liquid other than the hydrofluoric acid solution (HF liquid), namely, a liquid containing ammonium fluoride, for example. Thereafter, the wafer is dried.

The etching liquid used in the etching process is discharged from the chamber, and is collected to be reused. Namely, the etching liquid discharged from the chamber is returned to an etching-liquid supplying part for supplying an etching liquid onto a surface of a wafer, and the etching liquid is again supplied onto a surface of a wafer.

As a method for drying a wafer, there has been conventionally known a steam drying method in which a vapor of an organic solvent such as isopropyl alcohol (IPA) is supplied onto a surface of a wafer which is being rotated. It has been proposed, in order to prevent generation of watermarks on a surface of a wafer during the drying step, to supply a dehumidified air into a chamber so as to lower a humidity around the wafer.

DISCLOSURE OF THE INVENTION

However, in the conventional substrate processing method, there is a possibility that the following problem arises when the humidity around the wafer is lowered throughout all the processing steps including the etching step, the rinsing step, the drying step, and so on. That is to say, in the etching step, the HF liquid and the ammonium-fluoride based chemical liquid used in the etching process of the wafer is collected and reused. However, when an inside of the chamber is dried, moisture contained in the HF liquid or the like is evaporated with the repeated usage of the HF liquid or the like, so that a concentration of the HF liquid or the like is increased. Thus, when the HF liquid or the like is repeatedly used in the etching step, an etching rate of a wafer is gradually increased. In this case, there is a possibility that, when wafers are sequentially processed by the same HF liquid or the like one by one, etching rates of the wafers which are processed after, e.g., some tens of wafers have been processed, may be increased.

Since the HF liquid and the ammonium-fluoride based chemical liquid, which are used in the etching step, are chemical liquids that will reinforce a hydrophobic property of the wafer, it is preferable to supply a drying fluid such as IPA onto the surface of the wafer in the drying step of the wafer. The reason for this drying step using the drying fluid is considered to reduce generation of particles and watermarks on the surface of the wafer after it is dried.

When the humidity in the chamber is not decreased throughout all the processing steps including the etching step, the rinsing step, the drying step, and so on, moisture (steam) in the chamber is dissolved in the IPA liquid which is supplied onto the surface of the wafer in the drying step. Moisture dissolved in the IPA liquid may cause generation of particles on the surface of the wafer after it is dried.

Although the etching process is described by way of an example for processing a wafer with a process liquid, the same is true with the polymer removal process. Namely, as a polymer removal liquid, there is used an amine based chemical liquid containing a component (moisture) which is evaporated by a dried gas. Thus, when the amine based chemical liquid is supplied to a wafer to remove a polymer in a dried chamber, moisture contained in the chemical liquid is evaporated with the repeated usage of the amine based chemical liquid, which results in deterioration in ability for removing a polymer.

The present invention has been made in view of the above points. The object of the present invention is to provide a substrate processing method, a substrate processing apparatus, and a storage medium, which are capable of, in performing a substrate processing step with a process liquid and a drying step in the same process vessel (chamber), preventing deterioration in processing ability for a substrate to be processed, and generation of particles and watermarks on a surface of the substrate to be processed after it is dried, even when the process liquid is repeatedly used in the substrate processing step.

The present invention is a substrate processing method comprising: a first-gas supplying step for supplying a first gas from a first-gas supplying part into a chamber to fill the same with the first gas; a substrate processing step for supplying, with the chamber being filled with the first gas, a process liquid from a process-liquid supplying part onto a surface of a substrate to be processed in the chamber, so as to process the surface of the substrate to be processed, while the process liquid discharged from the chamber is returned to the process-liquid supplying part by a process-liquid collecting line; a second-gas supplying step for supplying a second gas whose humidity is lower than that of the first gas, from a second-gas supplying part into the chamber, so as to replace the first gas in the chamber with the second gas; and a drying step for supplying, with the chamber being filled with the second gas, a drying fluid from a drying-fluid supplying part onto the surface of the substrate to be processed, so as to dry the surface of the substrate to be processed.

Alternatively, the present invention is a substrate processing apparatus comprising: a chamber for housing a substrate to be processed; a process-liquid supplying part for supplying a process liquid into the chamber; a drying-fluid supplying part for supplying a drying fluid into the chamber; a process-liquid collecting line for collecting the process liquid discharged from the chamber and returning the same to the process-liquid supplying part; a first-gas supplying part and a second-gas supplying part for supplying into the chamber a first gas and a second gas whose humidity is lower than that of the first gas, respectively; and a controlling part for controlling the process-liquid supplying part, the drying-fluid supplying part, the first-gas supplying part, and the second-gas supplying part; wherein the controlling part controls the process-liquid supplying part, the drying-fluid supplying part, the first-gas supplying part, and the second-gas supplying part, such that a first gas is supplied from the first-gas supplying part into the chamber to fill the same with the first gas, and a process liquid is supplied, with the chamber being filled with the first gas, from the process-liquid supplying part onto a surface of a substrate to be processed in the chamber so as to process the surface of the substrate to be processed, while the process liquid discharged from the chamber is returned to the process-liquid supplying part by the process-liquid collecting line, and thereafter a second gas is supplied from the second-gas supplying part into the chamber to fill the same with the second gas, and a drying fluid is supplied, with the chamber being filled with the second gas, from the drying-fluid supplying part onto the surface of the substrate in the chamber so as to dry the surface of the substrate processing chamber.

In the above substrate processing method and the substrate processing apparatus, the process liquid used for processing the substrate to be processed is a liquid which is influenced by humidity change of a gas therearound, and the process liquid contains a component which is evaporated by a gas having relatively a low humidity (e.g. the second gas).

In the substrate processing method and the substrate processing apparatus of the present invention, the process liquid which has been used for processing the substrate to be processed is collected and reused in the substrate processing step. Since the chamber is filled with the first gas having relatively a higher humidity, the moisture in the process liquid is prevented from largely being evaporated, even when the process liquid is repeatedly used. Thus, even when the process liquid is repeatedly used in the substrate processing step, there is no deterioration in processing ability for the substrate to be processed. In addition, in the drying step, since the atmosphere in the chamber is replaced from the first gas to the second gas having a low humidity, it is possible to suppress dissolution of moisture in the drying fluid supplied onto the surface of the substrate to be processed. Thus, it is possible to prevent formation of particles and watermarks on the surface of the substrate to be processed after it is dried. Further, since the drying step is performed to the substrate to be processed, with the chamber being filled with the second gas having a low humidity, drying of the substrate to be processed can be more precipitated.

In the substrate processing method and the substrate processing apparatus of the present invention, it is preferable that the process liquid is an etching liquid. In this case, an etching step is performed as the substrate processing step. In the etching process, even when the etching liquid is repeatedly used, a concentration of the etching liquid is prevented from largely being increased. Thus, even when the etching liquid is repeatedly used in the etching step, there is not gradual increase in etching rate of the substrate to be processed, so that excessive etching of the substrate to be processed can be prevented. In addition, it is preferable that the etching liquid is a hydrofluoric acid solution, or a liquid containing ammonium fluoride.

Alternatively, in the substrate processing method and the substrate processing apparatus, it is preferable that the process liquid is a polymer removal liquid. In this case, a polymer removal step is performed as the substrate processing step. In the polymer removal step, even when the polymer removal liquid is repeatedly used, the moisture in the polymer removal liquid can be prevented from largely being evaporated. Thus, even when the polymer removal liquid is repeatedly used in the polymer removal step, there is no deterioration in processing ability for the substrate to be processed.

In the substrate processing method of the present invention, it is preferable that the substrate processing method further comprises, between the substrate processing step and the drying step, a rinsing step for supplying, at the second-gas supplying step, a rinse liquid from a rinse-liquid supplying part onto the surface of the substrate to be processed in the chamber, so as to clean the surface of the substrate to be processed. In addition, in the substrate processing apparatus of the present invention, it is preferable that the substrate processing apparatus further comprises a rinse-liquid supplying part for supplying a rinse liquid into the chamber, wherein the control part controls the rinse-liquid supplying part such that, between the substrate processing step and the drying step, when the second-gas is supplied, a rinse liquid is supplied from a rinse-liquid supplying part onto the surface of the substrate to be processed in the chamber, so as to clean the surface of the substrate to be processed.

In the substrate processing method and the substrate processing apparatus of the present invention, it is preferable that the drying liquid is an organic solvent. In particular, it is preferable that the organic solvent is a fluid containing isopropyl alcohol (IPA).

The present invention is a storage medium storing a program executable by a control computer of a substrate processing apparatus, the control computer capable of controlling the substrate processing apparatus upon execution of the program to carry out a substrate processing method comprising: a first-gas supplying step for supplying a first gas from a first-gas supplying part into a chamber to fill the same with the first gas; a substrate processing step for supplying, with the chamber being filled with the first gas, a process liquid from a process-liquid supplying part onto a surface of a substrate to be processed in the chamber, so as to process the surface of the substrate to be processed, while the process liquid discharged from the chamber is returned to the process-liquid supplying part by a process-liquid collecting line; a second-gas supplying step for supplying a second gas whose humidity is lower than that of the first gas, from a second-gas supplying part into the chamber, so as to replace the first gas in the chamber with the second gas; and a drying step for supplying, with the chamber being filled with the second gas, a drying fluid from a drying-fluid supplying part onto the surface of the substrate to be processed, so as to dry the surface of the substrate to be processed.

In the storage medium of the present invention, it is preferable that the substrate processing method further comprises, between the substrate processing step and the drying step, a rinsing step for supplying, at the second-gas supplying step, a rinse liquid from a rinse-liquid supplying part onto the surface of the substrate to be processed in the chamber, so as to clean the surface of the substrate to be processed.

DETAILED DESCRIPTION OF THE INVENTION

Figure 1:
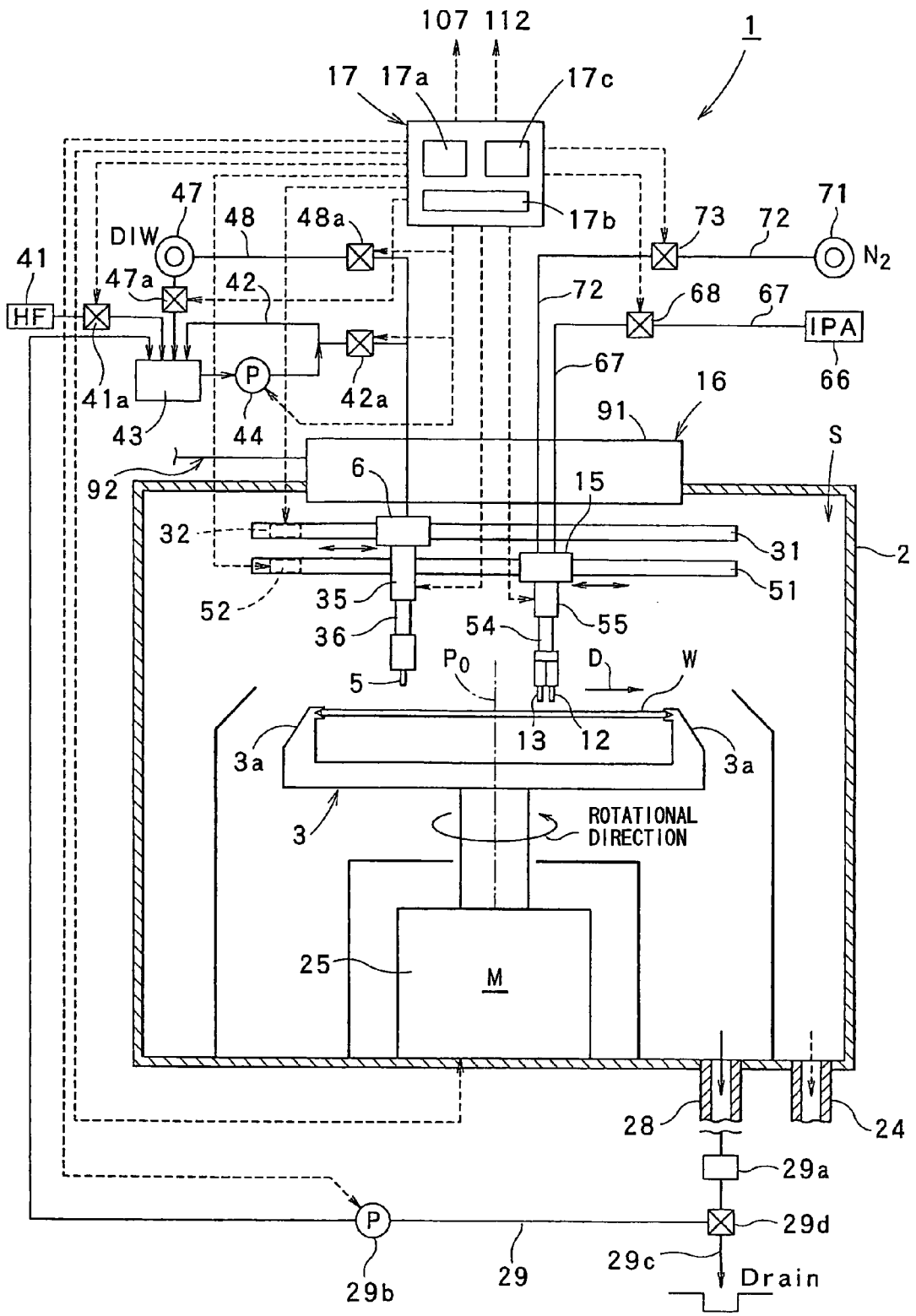
FIG. 1 is a schematic longitudinal sectional view showing a substrate processing apparatus in one embodiment of the present invention.

A preferred embodiment of the present invention is described hereinbelow based on a substrate processing apparatus that etches a surface of a semiconductor wafer W (hereinafter referred to as "wafer") as a substrate, and then cleans the surface of the wafer W. As shown in FIG. 1, a spin chuck 3 for substantially horizontally holding a substantially discoid wafer W is disposed in a chamber 2 of a substrate processing apparatus 1 in this embodiment. There is disposed a nozzle 5 serving as a chemical liquid nozzle for supplying an etching chemical liquid such as an HF liquid (hydrofluoric acid solution) to a wafer W, or serving as a rinse liquid nozzle for supplying a rinse liquid such as a deionized water (DIW). The nozzle 5 is supported by a nozzle arm 6. In addition, there are disposed a drying-fluid nozzle 12 for supplying an IPA (isopropyl alcohol) liquid as a drying fluid whose volatility is higher than that of the deionized water as a rinse liquid, and an inert-gas nozzle 13 as a drying gas nozzle for supplying an inert gas such as a nitrogen ($N_2$) gas as a drying gas. The drying-fluid nozzle 12 and the inert-gas nozzle 13 are supported by a drying nozzle arm 15. In addition, there is disposed a humidity adjusting mechanism 16 capable of adjusting a humidity of an atmosphere around a wafer W held by the spin chuck 3, i.e., a humidity of an atmosphere in the chamber 2 (in a processing space S). Control of the respective members of the substrate processing apparatus 1 is performed based on a command of a control computer 17 as a controller including a CPU. In the substrate processing apparatus 1 in this embodiment, both an etching process and a drying process can be carried out in the same chamber 2.

Figure 2:
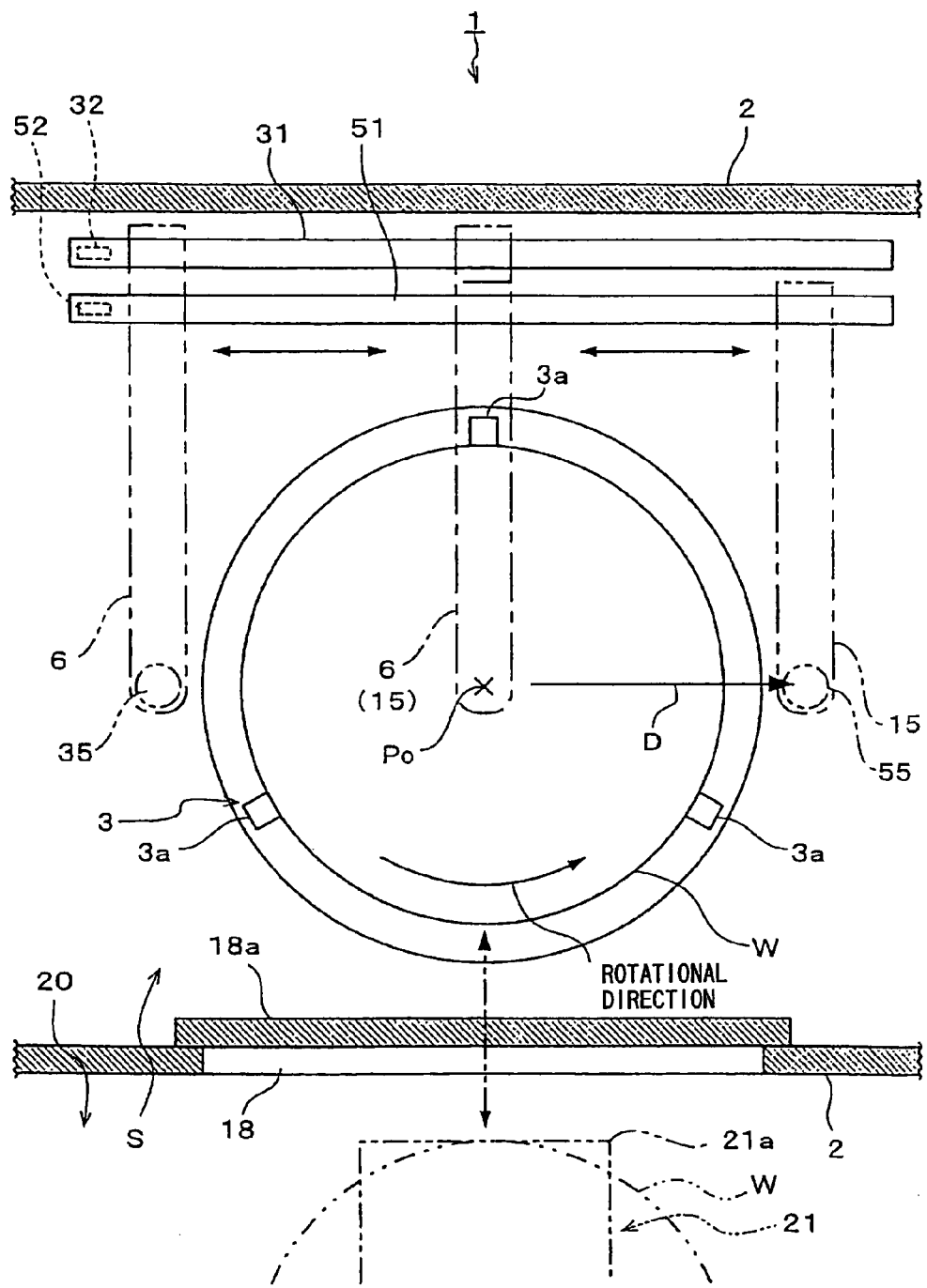
FIG. 2 is a schematic plan view showing a processing space in the substrate processing apparatus shown in FIG. 1.

As shown in FIG. 2, the chamber 2 is provided with a loading/unloading port 18 through which a wafer W is loaded into and unloaded from the processing space S in the chamber 2, and a shutter 18a for opening and closing the loading/unloading port 18. By closing the loading/unloading port 18, an atmosphere around a wafer W, i.e., the processing space S can be hermetically sealed. An outside of the loading/unloading port 18 provides a transfer area 20 where a wafer W is transferred. The transfer area 20 is provided with a transfer apparatus 21 including a transfer arm 21a for holding and transferring wafers W one by one. As shown in FIG. 1, an air-discharge passage 24 for evacuating the processing space S, and a liquid-discharge passage 28 for discharging an HF liquid in the chamber 2, are formed in a bottom surface of the chamber 2. The liquid-discharge passage 28 is connected to an HF-liquid collecting line 29. To be specific, a mist trap 29a is connected to the liquid-discharge passage 28, and a pump 29b is disposed in the HF-liquid collecting line 29 at a position downstream the mist trap 29a. The pump 29b is adapted to transfer an HF liquid, which has been sent from the chamber 2 into the mist trap 29a, to an HF-liquid tank 43 which is described below. A three-way valve 29d is disposed in the HF-liquid collecting line 29 at a position between the mist trap 29a and the pump 29b. A drain pipe 29c is diverged from the three-way valve 29d. By switching the three-way valve 29d, a waste liquid which is not collected by the pump 29d in the mist trap 29a is drained through the drain pipe 29c. Driving of the pump 29b is controlled by the control computer 17.

As shown in FIGS. 1 and 2, the spin chuck 3 has three holding members 3a on an upper part thereof. By bringing the holding members 3a into contact with a periphery of the wafer W at three positions, the wafer W is substantially horizontally held. A motor 25 for rotating the spin chuck 3 about a substantially vertical rotary central axis is disposed below the spin chuck 3. By driving the motor 25 to rotate the spin chuck 3 the wafer W together with the spin chuck 3 is rotated in a substantially horizontal plane about a substantial center Po of the wafer W as a rotational center. In the drawings, the wafer W is rotated counterclockwise (CCW) in a plan view where the wafer W is viewed from above. Driving of the motor 25 is controlled by the control computer 17.

The nozzle arm 6 is disposed above the wafer W supported on the spin chuck 3. A proximal end of the nozzle arm 6 is supposed such that the proximal end can move along a guide rail 31 which is substantially horizontally arranged. There is disposed a driving mechanism 32 for moving the nozzle arm 6 along the guide rail 31. By driving the driving mechanism 32, the nozzle arm 6 can move between a part above the wafer W supported on the spin chuck 3 and a part outside the periphery of the wafer W (left side in FIG. 1). In accordance with the movement of the nozzle arm 6, the nozzle 5 is moved relative to the wafer W from a part above the substantially central part of the wafer W toward a part above the peripheral part thereof. Driving of the driving mechanism 32 is controlled by the control computer 17.

The nozzle 5 is attached to a lower end of an elevating shaft 36 which is downwardly projected from an elevating mechanism 35 which is fixed on a lower surface of a distal end of the nozzle arm 6. The elevating shaft 36 can be vertically moved by the elevating mechanism 35, and thus the nozzle 5 can be vertically moved at a desired height. Driving of the elevating mechanism 35 is controlled by the control computer 17.

A chemical-liquid supply source 41 for supplying an HF liquid is connected to the nozzle 5 through a chemical-liquid supplying path 42 and an HF-liquid tank 43. To be specific, connected to the HF-liquid tank 43 are the chemical-liquid supply source 41 and a rinse-liquid (DIW) supply source 47 via on-off valves 41a and 47a, respectively. An HF liquid is supplied from the chemical-liquid supply source 41 to the HF-liquid tank 43, and a DIW is supplied from the rinse-liquid supply source 47 to the HF-liquid tank 43. The chemical-liquid supplying path 42 is connected to the HF-liquid tank 43. An HF liquid is drawn from the HF-liquid tank 43 by a pump 44 disposed in the chemical-liquid supplying path 42. The chemical-liquid supplying path 42 is diverged, with one diverged end thereof being communicated with the nozzle 5 through the on-off valve 42a, while the other diverged end being returned again to the HF-liquid tank 43. In the HF-liquid collecting line 29, an HF liquid is returned also from the mist trap 29a to the HF-liquid tank 43 by the pump 29b. In addition, connected to the nozzle 5 is a rinse-liquid supplying path 48 which is connected to the rinse-liquid (DIW) supply source 47 for supplying the DIW. An on-off valve 48a is disposed in the rinse-liquid supplying path 48. Opening and closing operations of the respective on-off valves 41a, 42a, 47a, and 48a are controlled by the control computer 17.

When the on-off valve 42a is closed by the control computer 17, an HF liquid, which has been drawn from the HF-liquid tank 43 by the pump 44, is returned again to the HF-liquid tank 43 through the chemical-liquid supplying path 42, so that the HF liquid is circulated. On the other hand, when the on-off valve 42a is opened by the control computer 17, the HF liquid, which has been drawn from the HF-liquid tank 43 by the pump 44, is sent to the nozzle 5. Driving of the pump 44 is controlled by the control computer 17.

A drying nozzle arm 15 is disposed above the wafer W supported on the spin chuck 3. A proximal end of the drying nozzle arm 15 is supported such that the proximal end can move along a guide rail 51 which is substantially horizontally arranged. There is disposed a driving mechanism 52 for moving the drying nozzle arm 15 along the guide rail 51. By driving the driving mechanism 52, the drying nozzle arm 15 can move between a part above the wafer W and a part outside the periphery of the wafer W (right side in FIG. 1). In accordance with the movement of the drying nozzle arm 15, the drying-fluid nozzle 12 and the inert-gas nozzle 13 are moved relative to the wafer W from a part above the wafer W toward a part above the peripheral part thereof. Driving of the driving mechanism 52 is controlled by the control computer 17.

An elevating mechanism 55 including an elevating shaft 54 is fixed on a lower surface of a distal end of the drying nozzle arm 15. The elevating shaft 54 is arranged to project downward from the elevating mechanism 55. The drying-fluid nozzle 12 and the inert-gas nozzle 13 are attached to a lower end of the elevating shaft 54. The elevating shaft 54 is stretched by driving the elevating mechanism 55, so that the drying-fluid nozzle 12 and the inert-gas nozzle 13 are integrally, vertically moved. Driving of the elevating mechanism 55 is controlled by the control computer 17. That is, based on a command of the control computer 17, driving of the driving mechanism 52 is controlled to horizontally move the drying nozzle arm 15, the drying-fluid nozzle 12, and the inert-gas nozzle 13, while driving of the elevating mechanism 55 is controlled to adjust the height positions of the drying-fluid nozzle 12 and the inert-gas nozzle 13.

The drying-fluid nozzle 12 and the inert-gas nozzle 13 are arranged adjacent to each other above the wafer W along a substantially radial linear line connecting the center of the wafer W and a peripheral right end thereof. In FIG. 1, the inert-gas nozzle 13 is disposed on a left side of the drying-fluid nozzle 12. Namely, in FIG. 1, when the drying-fluid nozzle 12 is moved by the movement of the drying nozzle arm 15 in a moving direction D from the center Po of the wafer W toward the peripheral right end thereof, the inert-gas nozzle 13 is configured to follow the drying-fluid nozzle 12, while the inert-gas nozzle 13 is positioned rearward the drying-fluid nozzle 12 in the moving direction D, i.e., the inert-gas nozzle 13 is positioned between the center Po and the drying-fluid nozzle 12 in a plan view.

To the drying-fluid nozzle 12, there is connected a fluid supplying path 67 connected to a fluid supply source 66 such as a tank storing an IPA liquid. A on-off valve 68 is disposed in the fluid supplying path 67. An opening and closing operation of the on-off valve 68 is controlled by the control computer 17.

To the inert-gas nozzle 13, there is connected an inert-gas supplying path 72 connected to an inert-gas ($N_2$) supply source 71. An on-off valve 73 is disposed in the inert-gas supplying path 72. An opening and closing operation of the on-off valve 73 is controlled by the control computer 17.

Next, the humidity adjusting mechanism 16 is described. As shown in FIG. 1, the humidity adjusting mechanism 16 includes a gas supply chamber 91 for blowing a clean air or a CDA (Clean Dried Air (low dew-point clean air)) as a humidity adjusting gas (air) into the processing space S, and a humidity-adjusting gas supply line 92 for supplying a humidity adjusting gas into the gas supply chamber 91. The humidity adjusting mechanism 16 is controlled by the control computer 17.

Figure 3:
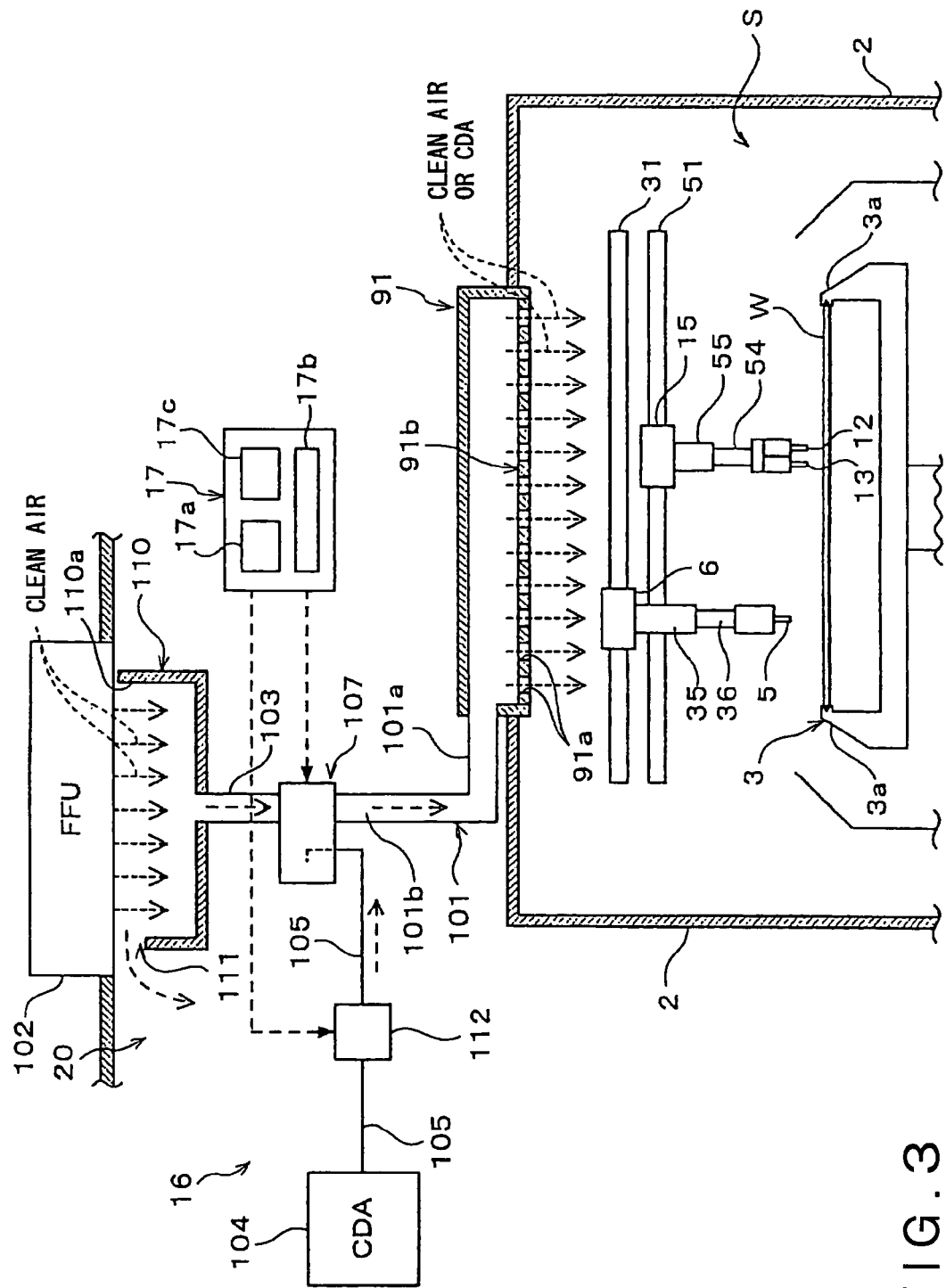
FIG. 3 is an explanation view explaining a structure of a humidity adjusting mechanism in the substrate processing apparatus shown in FIG. 1.

The gas supply chamber 91 is disposed on a ceiling part of the chamber 2, i.e., above a wafer W held by the spin chuck 3. As shown in FIG. 3, a plurality of gas discharging holes 91a, which discharge a humidity adjusting gas from an inside of the gas supply chamber 91, are formed in the overall lower surface of the gas supply chamber 91 in a uniformly dispersed manner. That is, the plurality of gas discharging holes 91a are opposed to the overall surface of the wafer W held by the spin chuck 3, so that a rectified downflow of a humidity adjusting gas is formed in the processing space S. A lower plate 91b constituting the lower surface of the gas supply chamber 91 may be made of a punching plate (punching screen), i.e., a plate having a number of holes formed by press punching, and the holes opened in the punching plate may serve as the gas charging holes 91a.

Connected to a sidewall of the gas supply chamber 91 is a downstream end (a horizontal part 101a of a main supplying path 101 which is described below) of the humidity-adjusting gas supply line 92.

The humidity-adjusting gas supply line 92 includes: the main supplying path 101 for introducing a humidity-adjusting gas into the processing space S; an FFU (Fan Filter Unit) 102 as a humidity-adjusting gas supply source for supplying a clean air; a clean-air supplying path 103 for introducing the clean air supplied from the FFU 102 into the main supplying path 101; a CDA supply source 104 as a humidity-adjusting gas supply source (low dew-point gas supply source) for supplying a CDA; and a CDA supplying path (low dew-point gas supplying path) 105 for introducing the CDA supplied from the CDA supply source 104 into the main supplying path 101. An upstream end of the main supplying path 101 and a downstream end of the clean-air supplying path 103 are connected to each other via a switching damper 107. The upstream end of the main supplying path 101 and a downstream end of the CDA supplying path 105 are also connected to each other via the switching damper 107.

The main supplying path 101 is an inside flow path of a tubular duct, for example, and formed into a substantially L-shape having the horizontal part 101a extended substantially in a horizontal direction, and a vertical part 101b extended substantially in a vertical direction. A distal end of the horizontal part 101a is opened to the sidewall of the gas supply chamber 91. An upper end of the vertical part 101b is opened to the switching damper 107 (a lower surface of the housing 121 described below).

The FFU 102 is disposed outside the chamber 2 and above the same. For example, the FFU 102 is disposed on a ceiling part of a clean room in which the substrate processing apparatus 1 is disposed, or on a ceiling part of a processing system incorporating the substrate processing system 1. In the drawings, the FFU 102 is disposed on a ceiling part of the transfer area 20. In addition, although not shown, the FFU 102 includes an air blower for blowing air, a filter for purifying air to create a clean air, and so on. A current plate and a plurality of clean-air discharging holes for discharging a clean air are formed in a lower surface of the FFU 102, so that a rectified clean air is discharged from the lower surface of the FFU 102 to form a clean air downflow.

Below the FFU 102, there is disposed an introducing cup 110 for receiving a clean air supplied from the FFU 102 and introducing the same into the clean-air supplying path 103. An upper surface of the introducing cup 110 provides an opening 110a. The introducing cup 110 is arranged such that the opening 110a is opposed to the lower surface of the FFU 102. An upstream end of the clean-air supplying path 103 is connected to a lower surface of the introducing cup 110. Between an upper periphery of one sidewall of the introducing cup 110 and the lower surface of the FFU 102, there is formed a gap 111 as a clean-air discharging port for discharging a clean air from the introducing cup 110.

The clean-air supplying path 103 is an inside flow path of a tubular duct, for example, and is linearly extended downward from the lower surface of the introducing cup 110 substantially in the vertical direction. A downstream end of the clean-air supplying path 103 is connected to an upper surface of the switching damper 107 (an upper surface of the below-described housing 121). The clean-air supplying path 103 and the vertical part 101b of the main supplying path 101 are arranged along substantially the same vertical line in such a manner that a downstream end of the clean-air supplying path 103 and an upstream end of the vertical part 101b are opposed to each other, with an inside of the switching damper 107 (a clean-air supplying path connecting chamber 123 described below) being interposed therebetween.

A cylinder storing therein a compressed CDA is used as the CDA supply source 104, for example. A CDA is a dried air that is obtained by refining (removing) impurities such as organic matters and moisture in a compressed air by means of a refiner which is filled with an absorbent or a catalyst. A humidity of the CDA is significantly lower than a general air (atmospheric air) and a clean air supplied from the FFU 102. In other words, a dew-point temperature of the CDA is lower than the general air and the clean air. It is sufficient that a dew point of the CDA supplied from the CDA supply source 104 is not more than, e.g., about −40° C., more preferably, about −110° C. to −120° C.

An on-off valve 112 is disposed in the CDA supplying path 105. The on-off valve 112 is capable of switching the CDA supplying path 105 from a state in which an upstream side (a side of the CDA supply source 104 and a downstream side (a side of the switching damper 107) are disconnected from each other, to a state in which the upstream side and the downstream side are communicated with each other, and vice versa. A downstream end of the CDA supplying path 105 is connected to the switching damper 107. An opening and closing operation of the on-off valve 112 is controlled by the control computer 17.

Figure 4:
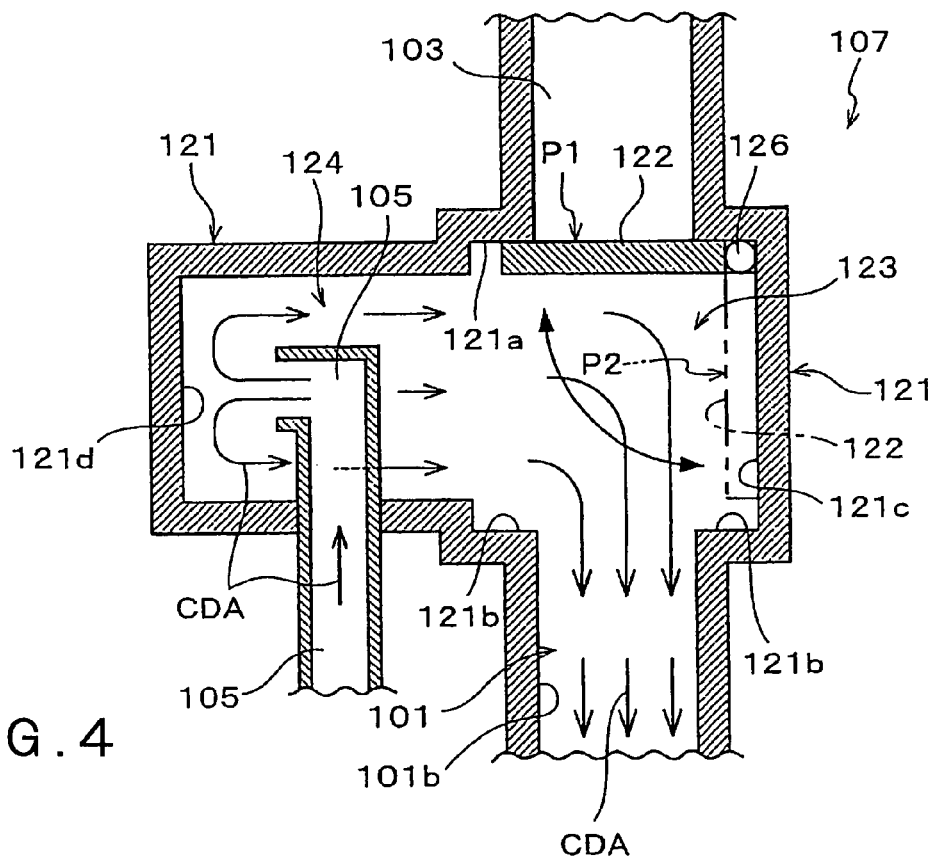
FIG. 4 is a schematic longitudinal sectional view showing a structure of a switching damper in the humidity adjusting mechanism shown in FIG. 3, and explaining a state in which a clean-air supplying path and a main supplying path are disconnected from each other.
Figure 5:
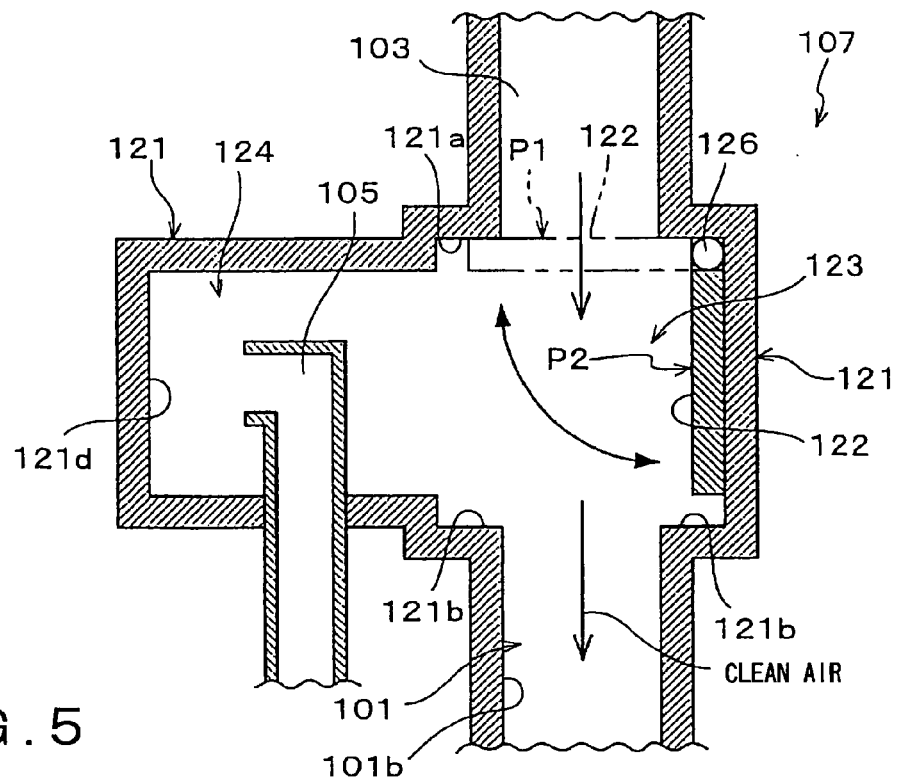
FIG. 5 is a schematic longitudinal sectional view showing the structure of the switching damper in the humidity adjusting mechanism shown in FIG. 3, and explaining a state in which the clean-air supplying path and the main supplying path are communicated with each other.

As shown in FIGS. 4 and 5, the switching damper 107 includes the housing 121, and a substantially flat-plate movable member 122 disposed in the housing 121. The movable member 122 opens and closes a downstream end opening of the clean-air supplying path 103.

The housing 121 has an shape substantially resembling a rectangular solid, for example, and includes the clean-air supplying path connecting chamber 123 to which an end of the clean-air supplying path 103 is connected, and a CDA supplying path connecting chamber 124 to which an end of the CDA supplying path 105 is connected. The clean-air supplying path connecting chamber 123 and the CDA supplying path connecting chamber 124 are laterally adjacent to each other and are communicated with each other. In the drawings, a right half (a part near an inner side surface 121c of the housing 121) provides the clean-air supplying path connecting chamber 123, and the rest left half (a part near an inner side surface 121d which is opposed to the inner side surface 121c and the clean-air supplying path connecting chamber 123) provides the CDA supplying path connecting chamber 124.

In the clean-air supplying path connecting chamber 123, a downstream end of the clean-air supplying path 103 is opened to an upper surface (ceiling surface) 121a of the housing 121, and an upstream end of the main supplying path 101 (vertical part 101b) is opened to a lower surface (bottom surface) 121b of the housing 121. Namely, the end of the clean-air supplying path 103 is disposed above the end of the main supplying path 101 to be opposed thereto, with the clean-air supplying path connecting chamber 123 being interposed between the end of the clean-air supplying path 103 and the end of the main supplying path 101, so that the end of the clean-air supplying path 103 is oriented in a direction for discharging a clean air toward the end of the main supplying path 101.

The movable member 122 is disposed in the clean-air supplying path connecting chamber 123, and is rotatably supported relative to the housing 121 via a rotary central shaft 126. The rotary central shaft 126 is disposed in the clean-air supplying path connecting chamber 123 on a lateral side of the end of clean-air supplying path 103 (on a side of the inner side surface 121c) at a part near the upper surface 121a of the housing 121, so as to support a periphery of the movable member 122. The movable member 122 is rotated about the rotary central shaft 126 so that one side surface (upper surface) of the movable member 122 moves toward the end of the clean-air supplying path 103 and moves apart therefrom. Specifically, the movable member 122 can move between a closing position P1 (FIG. 4) in which the movable member 122 is laterally positioned along the upper surface 121a to close the end of the clean-air supplying path 103 by the one surface of the movable member 122, and an opening position P2 (FIG. 5) in which the movable member 122 is apart from the end of the clean-air supplying path 103 to open the same. At the opening position P2, the movable member is longitudinally positioned along the inner side surface 121c below the rotary central shaft 126. Such a rotating operation of the movable member 122, i.e., an operation for switching the communicating state of the clean-air passage 103 to the main supplying path 101 to the discontinuing state of the clean-air passage 103 from the main supplying path 101, and vice versa, is controlled by the control computer 17.

The CDA supplying path connecting chamber 124 is disposed on a side of the inner side surface 121d of the housing 121. A downstream end part of the CDA supplying path 105 is inserted into the CDA supplying path connecting chamber 124 such that the CDA supplying path 105 vertically passes through the lower surface 121b of the housing 121. The downstream end of the CDA supplying path 105 is opened to be opposed to the inner side surface of the 121d, and is oriented in a direction for discharging a CDA toward the inner side surface 121d. That is to say, inside the switching damper 107, the end of the CDA supplying path 105 is disposed at a position where the end of the CDA supplying path 105 is not opposed to the end of the main supplying path 101, and is oriented in a direction for discharging a CDA toward a position different from the end of the main supplying path 101. In this manner, a flow force of a CDA discharged from the end of the CDA supplying path 105 can be weakened, as compared with a case in which the end of the CDA supplying path 105 is oriented toward the clean-air supplying path connecting chamber 123, and a case in which the end of the CDA supplying path 105 is oriented in a direction for discharging a CDA toward the end of the main supplying path 101.

Next, the control computer 17 is described. As shown in FIG. 1, the respective functional elements of the substrate processing apparatus 1 are connected to the control computer 17, which automatically controls the overall operation of the substrate processing apparatus 1, through a signal line. Herein, the functional elements mean all the elements that operate for achieving a predetermined process condition, including, for example, the motor 25, the pumps 29b and 44, the driving mechanism 32, the elevating mechanism 35, the driving mechanism 52, the elevating mechanism 55, the on-off valves 41a, 42a, 47a, 48a, 68, and 73, the switching damper 107, the on-off valve 112, and so on. The control computer 17 is typically a multi-purpose computer capable of realizing a given function depending on a software to be executed.

As shown in FIG. 1, the control computer 17 includes a computing part 17a having a CPU (Central Processing Unit), a input/output part 17b connected to the computing part 17a, and a storage medium 17c inserted in the input/output part 17b and storing a control software. By executing the control computer, the control computer 17 controls the respective functional elements of the substrate processing apparatus 1 such that various process conditions (e.g., a rotational speed of the motor 25) defined by a predetermined process recipe are realized. As described in detail below, a substrate processing method based on the control software includes an etching step, a rinsing step, and a drying step. Control operations for performing these steps are sequentially carried out.

The storage medium 17c may be built in the control computer 17. Alternatively, the storage medium 17c may be removably fixed on a reader, not shown, mounted on the control computer 17, and may be readable by the reader. In the most typical case the storage medium 17c is a hard disk drive in which the control software has been installed by an operator of a manufacturing company of the substrate processing apparatus 1. In another case, the storage medium 17c is a removable disk such as a CD-ROM or a DVD-ROM in which the control software has been written. Such a removable disk is read by an optical reader, not shown, disposed on the control computer 17. The storage medium 17c may either be of a RAM (random access memory) type or a ROM (read only memory) type. Alternatively, the storage medium 17c may be a cassette type ROM. In short, any medium known in the technical field of a computer can be employed as the storage medium 17c. In a factory where the plurality of substrate processing apparatuses 1 are located, the control software may be stored in an executive computer that collectively controls the control computers 17 of the respective substrate processing apparatuses 1. In this case, the respective substrate processing apparatuses 1 are operated by the executive computer via communication lines to perform predetermined processes.

Next, a method of processing a wafer W using the substrate processing apparatus 1 as structured above is described below. At first, a summary of the processing method is briefly described. That is, under the state that the chamber 2 filled with a clean air having relatively a higher humidity, an HF liquid is supplied from the chemical-liquid supply source 41 onto a surface of a wafer W which is being rotated, so as to etch the surface of the wafer W. Then, the atmosphere in the chamber is replaced from the clean air to a CDA, so that the humidity in the processing space S is significantly decreased. Thereafter, a rinsing step is performed by supplying a deionized water onto the surface of the wafer W which is being rotated. Then, with the chamber 2 being filled with the CDA, an IPA liquid is supplied from the fluid supply source 66 onto the surface of the wafer W which is being rotated, so as to form an IPA liquid film on the surface of the wafer W. Finally, while continuing rotation of the wafer W, an IPA liquid and a nitrogen gas are supplied onto the surface of the wafer W so as to dry the surface of the wafer W. Herein, the formation step of forming the IPA liquid film on the surface of the wafer W, and the succeeding drying step of drying the surface of the wafer W, are collectively referred to as "drying process".

The respective steps of the above-described processing method are described in detail below.

At first, there is described a supply operation of a clean air having relatively a higher humidity from the gas supply chamber 91 into the chamber 2. This supply operation of a clean air into the chamber 2 is performed before the etching process for the wafer W or during the same. In this case, based on a control command of the control computer 17, the movable member 122 of the switching damper 107 is located at the opening position P2 (see, FIG. 5), and the on-off valve 112 is closed. Namely, the FFU 102 and the clean-air supplying path 103 are communicated with the main supplying path 101, and the CDA supply source 104 and the CDA supplying path 105 are disconnected from the main supplying path 101.

Under this state, a clean air sent from the FFU 102 flows into the introducing cup 110 through the opening 110a, and the clean air is introduced from the introducing cup 110 through the clean-air supplying path 103 into the clean-air supplying path connecting chamber 123 of the switching damper 107. Then, the clean air is introduced from the clean-air supplying path connecting chamber 123 through the main supplying path 101 into the gas supply chamber 91. The clean air is rectified by passing through the plurality of gas discharging holes 91a, and is discharged downward. In this manner, by passing through the introducing cup 110, the clean-air supplying path 103, the clean-air supplying path connecting chamber 123, the main supplying path 101, and the gas supply chamber 91, in this order, the clean air supplied from the FFU 102 is introduced into the processing space S. The clean air supplied into the processing space S flows downward in the processing space S, and is discharged therefrom through the air-discharge passage 24. By supplying the clean air into the processing space S while discharging the same from the processing space S, the atmosphere in the processing space S is replaced with the clean air. In this case, a dew-point temperature of the atmosphere in the processing space S becomes substantially the same as that of a clean room, for example.

Next, a supply operation of a CDA from the gas supply chamber 91 into the chamber 2 is described. This supply operation of a CDA into the chamber 2 is performed during the rinsing step for the wafer W or during the drying step. In this case, based on a control command of the control computer 17, the movable member 122 of the switching dumper 107 is located at the closing position P1 (see, FIG. 4), and the on-off valve 112 is opened. Namely, the FFU 102 and the clean-air supplying path 103 is disconnected from the main supplying path 101 by the movable member 122, and the CDA supply source 104 and the CDA supplying path 105 are communicated with the main supplying path 101.

Under this state, a CDA sent from the CDA supply source 104 is introduced into the CDA supplying path connecting chamber 124 of the switching dumper 107 through the CDA supplying path 105. As shown in FIG. 4, in the CDA supplying path connecting chamber 124, the CDA is laterally discharged from the end of the CDA supplying path 105 toward the inner side surface 121d which is positioned oppositely to the clean-air supplying path connecting chamber 123. Then, upon collision of the CDA against the inner side surface 121d, a direction of the airflow is inverted, i.e., the airflow is directed toward the clean-air supplying path connecting chamber 123. Subsequently, the CDA flows from the CDA supplying path connecting chamber 124 into the clean-air supplying path connecting chamber 123 to flow into the end of the main supplying path 101 disposed below the clean-air supplying path connecting chamber 123, and then the CDA is introduced into the gas supply chamber 91 through the main supplying path 101. After that, the CDA is rectified by passing through the plurality of gas discharging holes 91a, and is discharged downward. By passing through the CDA supplying path 105, the CDA supplying path connecting chamber 124, the clean-air supplying path connecting chamber 123, the main supplying path 101, and the gas supply chamber 91, in this order, the CDA supplied from the CDA supply source 104 is introduced into the processing space S. The CDA supplied into the processing space S flows downward in the processing space S, and is discharged therefrom through the air-discharge passage 24 disposed in the bottom of the chamber 2. By supplying the CDA into the processing space S while discharging the same from the processing space S, the atmosphere in the processing space S is replaced with the CDA, so that the humidity of the processing space S is decreased (a dew-point temperature is lowered). The dew-point temperature of the atmosphere in the processing space S is lowered to the same dew-point temperature, e.g., not more than about $-40°$ C., more preferably, about $-110°$ C. to $-120°$ C. Thus, in the formation step of the IPA liquid film and the drying step which are carried out in the drying step described below, an amount of moisture taken into the IPA can be decreased. In addition, in the drying process, a drying property for a wafer W can be improved. In general, a temperature of a clean room in which the substrate processing apparatus 1 is installed is a normal temperature (about $23°$ C.), and a relative humidity thereof is about 40% to 45%. On the other hand, the humidity in the processing space S is decreased as compared with the relative humidity of the clean room.

Next, the etching process for a wafer W is described. At first, the inlet/outlet port 18 is opened. Then, a wafer W, which is not processed yet, is loaded into the processing space S by the transfer arm 21a of the transfer apparatus 21, and the wafer W is delivered to the spin chuck 3, as shown in FIG. 1. As shown by the two-dot chain lines in FIG. 2, when the wafer W is delivered to the spin chuck 3, the nozzle arm 6 and the drying nozzle arm 15 are respectively retracted beforehand at standby position positioned right and left sides of the spin chuck 3.

After the wafer W is delivered to the spin chuck 3, the transfer arm 21a is drawn from the processing space S, and the loading/unloading port 18 is closed by the shutter 18a. Then, rotation of the spin chuck and the wafer W is started by driving the motor 25 so as to start the etching process. A clean air is supplied from the gas supply chamber 91 into the chamber 2, so that the chamber 2 is filled with the clean air. Under this state, the nozzle arm 6 is moved toward a position (chain lines in FIG. 2) above the wafer W, so that the nozzle 5 is located at a position above the center Po of the wafer W. Thereafter, the on-off valve 42a is opened to send an HF liquid from the chemical-liquid supplying path 42 to the nozzle 5, so that the HF liquid is supplied toward the center Po of the rotating wafer W from the nozzle 5. The HF liquid supplied onto the center Po is dispersed over the whole surface of the wafer W by the centrifugal force, so that the surface of the wafer W is etched by the HF liquid. At this time, the HF liquid in the chamber 2 is discharged through the liquid-discharge passage 28. The discharged HF liquid is sent to the mist trap 29a, and is returned to the HF-liquid tank 43 by the pump 29b. In this manner, the HF liquid is collected and reused. After the wafer W is subjected to the etching process, a hydrophobic property of the surface of the wafer W is increased as compared with the wafer W which is not subjected to the etching process.

After the on-off valve 42a is closed to complete the etching liquid process, the rinsing process is performed. In the rinsing process, a CDA is supplied from the gas supply chamber 91 into the chamber 2, at first, to replace the atmosphere in the chamber 2 from the clean air to the CDA. Then, while rotating the wafer W, by opening the on-off valve 48a, a deionized water is supplied from the nozzle 5 toward the center Po of the wafer W. The deionized water supplied onto the center Po is dispersed over the whole surface of the wafer W by the centrifugal force. The HF liquid adhering to the wafer W is thus washed away from the wafer W by the deionized water. After the wafer W is sufficiently rinsed with the deionized water, the on-off valve 48a is closed to stop the supply of the deionized water from the nozzle 5, and the nozzle arm 6 is retracted from the position above the wafer W to be returned to the standby position.

After the rinsing process is finished, the drying process for drying the wafer W is performed, with the chamber 2 being filled with the CDA. Specifically, the IPA-liquid film formation process for forming a liquid film of an IPA liquid on the wafer W is performed at first, and subsequently the wafer W is dried by an IPA liquid and a nitrogen gas.

Figure 6:
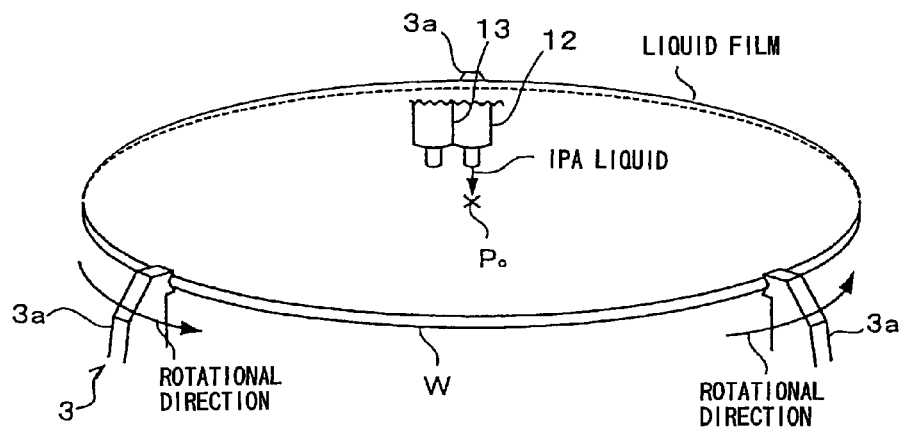
FIG. 6 is an explanation view explaining arrangement of a fluid nozzle when an IPA liquid film is formed on a wafer.

In the first place, the IPA-liquid film formation process is described in detail below. The drying nozzle arm 15 is moved to a position above the wafer W (chain lines in FIG. 2), so that the drying-fluid nozzle 12 is located at a position above the center Po of the wafer W. Following thereto, as shown in FIG. 6, while the wafer W is being rotated by the spin chuck 3, an IPA liquid is supplied from the drying-fluid nozzle 12 toward the center Po of the wafer W. The IPA liquid supplied onto the center Po is dispersed over the whole surface of the wafer W by the centrifugal force so that the IPA liquid is applied like a liquid film on the whole surface of the wafer W.

By forming the liquid film of the IPA liquid on the surface of the wafer W, the deionized water can be replaced with the IPA on the overall surface of the wafer W. Since the surface of the wafer W is covered with the liquid film of the IPA liquid, natural drying of the surface of the wafer W, especially a peripheral part of the upper surface of the wafer W can be prevented. In this case, generation of particles and watermarks on the surface of the wafer W can be prevented. In particular, even when a hydrophobic property of the surface of the wafer W is reinforced by the etching process with the HF liquid, generation of particles can be effectively prevented. In addition, even when the wafer W is of a large diameter, it is possible to suppress generation of particles (striped watermarks generated by precipitation of a chemical liquid or the like) formed near the peripheral part of the wafer W.

Figure 7:
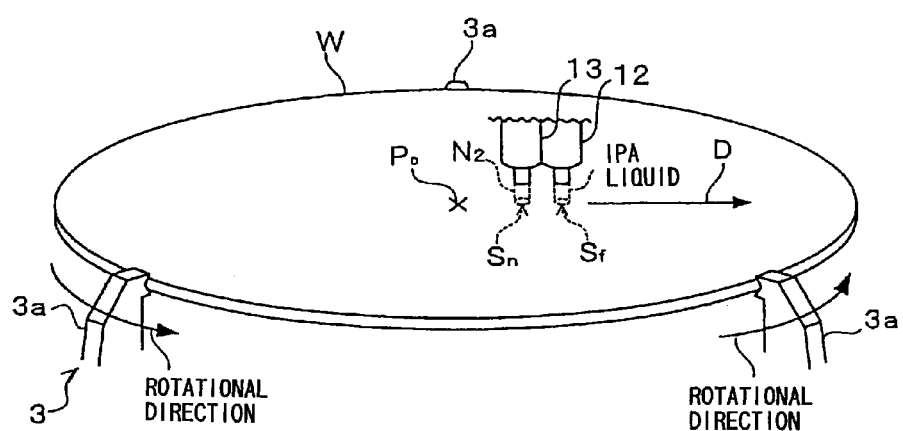
FIG. 7 is an explanation view explaining operations of the fluid nozzle and an inert-gas nozzle when a wafer is dried.

After the liquid film of the IPA liquid is formed on the surface of the wafer W, the wafer W is dried by supplying thereto an IPA liquid and a nitrogen gas. At first, the drying-fluid nozzle 12 and the inert-gas nozzle 13 are located at positions above and near the center Po of the wafer W, and supply of an IPA liquid from the drying-fluid nozzle 12 and supply of a nitrogen gas from the inert-gas nozzle 13 are started. While the wafer W is being rotated by the spin chuck 3, an IPA liquid and a nitrogen gas are supplied, and the drying nozzle arm 15 is moved at the same time. Thus, the drying-fluid nozzle 12 and the inert-gas nozzle 13 are moved together with the drying nozzle arm 15 in a moving direction D. As shown in FIG. 7, a supply position Sf on the surface of the wafer where an IPA liquid is supplied from the drying-fluid nozzle 12, and a supply position Sn on the surface of the wafer where a nitrogen gas is supplied from the inert-gas nozzle 13, are moved in the moving direction D to scan a distance between the center Po and the periphery of the wafer W. In this manner, while rotating the wafer W, the supply position Sf of an IPA liquid and the supply position Sn of a nitrogen gas are moved at least from the center Po of the wafer W to the peripheral part thereof, so that the IPA liquid and the nitrogen gas can be supplied over the overall surface of the wafer W.

The IPA liquid supplied onto the surface of the rotating wafer W flows toward an outer circumference of the wafer W by the centrifugal force. While the supply position Sf of an IPA liquid is moved from the side of the center Po of the wafer W toward the side of the peripheral part thereof, the nitrogen gas supplied from the inert-gas nozzle 13 is supplied onto the supply position Sn adjacent to the supply position Sf, the supply position Sn being always nearer to the center Po of the wafer W than the supply position Sf of an IPA liquid. The supply position Sn of a nitrogen gas is moved from the side of the center Po toward the center of the peripheral part to follow the supply position Sf, with the supply position Sn being arranged between the center Po and the supply position Sf.

Since a nitrogen gas is supplied onto the supply position Sn adjacent to the center Po relative to the supply position Sf, the IPA liquid supplied onto the surface of the wafer W is immediately washed away by the nitrogen gas, so that drying of the wafer W can be precipitated. Further, the surface of the wafer W can be uniformly, effectively dried. Furthermore, since an oxygen concentration as a cause for generating watermarks can be lowered, generation of watermarks can be prevented. Moreover, generation of particles caused by a difference in volatility of an IPA and a deionized water can be prevented, which can improve a quality of the wafer W.

After the supply position Sf of an IPA liquid is moved to the periphery of the wafer W, the supply of the IPA liquid from the drying-fluid nozzle 12 is stopped. Then, the supply position Sn of a nitrogen gas is moved to the periphery of the wafer W, the supply of the nitrogen gas from the nitrogen gas nozzle 13 is stopped. Therefore, the drying process is completed.

After the drying process, the rotation of the spin chuck 3 is stopped to make still the wafer W. By opening the loading/unloading port 18, the transfer arm 21a is moved into the chamber 2, receives the wafer W from the spin chuck 3, and then unloads the wafer W from the camber 2. The on-off valve 112 is closed to stop the supply of a CDA into the chamber 2, while a clean air is supplied from the FFU 102 into the chamber 2 so as to replace the atmosphere in the chamber 2 from the CDA to the clean air. In this manner, a series of processes for the wafer W in the processing substrate apparatus 1 are completed.

As described above, according to the substrate processing apparatus 1 in this embodiment and the substrate processing method using the substrate processing apparatus 1, a clean air having relatively a higher humidity is supplied from the FFU 102 into the chamber 2 to fill the same with the clean air. Under this state, an HF liquid is supplied onto a surface of a wafer W in the chamber 2 to etch the surface of the wafer W. At this time, the HF liquid discharged from the chamber 2 is returned to the HF-liquid tank 43 by means of the HF-liquid collecting line 29. Thereafter, a CDA having a lower humidity is supplied from the CDA supply source 104 into the chamber 2 to fill the same with the CDA. Under this state, an IPA liquid is supplied from the fluid supply source 66 onto the surface of the wafer W in the chamber 2 so as to dry the surface of the wafer W.

Due to the process of the wafer W, the HF liquid used for the etching process for the wafer W can be collected and reused in the etching step. However, since the chamber 2 is filled with the clean gas having relatively a higher humidity, even when the HF liquid is repeatedly used, evaporation of moisture in the HF liquid can be restrained so that the concentration of the HF liquid is not significantly increased. Thus, even when the HF liquid is repeatedly used in the etching step, there is no possibility that an etching rate of the wafer W is remarkably increased. Namely, it is possible to prevent that the wafer W is excessively etched by the repeatedly used HF liquid. In addition, in the drying step, since the atmosphere in the chamber 2 is replaced from the clean gas to a CCD having a low humidity, it is possible to restrain that moisture is dissolved in the IPA liquid which is supplied onto the surface of the wafer W, so that formation of particles and watermarks on the surface of the wafer W after it is dried can be prevented. Further, since the wafer W is subjected to the drying process in the chamber 2 filled with the CCD having a low humidity, drying of the wafer W can be more precipitated.

Although the preferred embodiment of the present invention has been described above by way of an example, the present invention is not limited to the above-described embodiment. Various changes and modifications are obvious for those skilled in the art within a technical scope recited in the claims, and such changes and modifications are naturally considered to be included in the technical scope of the present invention.

For example, in the above-described embodiment, a hydrofluoric acid solution (HF) is used as an etching liquid. However, in place thereof, a liquid containing ammonium fluoride may be used as an etching liquid. In this case, similar to the fluoric acid solution, since the liquid containing ammonium fluoride is a liquid containing a component (moisture) which is evaporated by a dried gas, the effect which is the same as when the hydrofluoric acid solution (HF) is used can be obtained. Namely, when the liquid containing ammonium fluoride is used as an etching liquid, similar to the case where the hydrofluoric acid solution is used as an etching liquid, there is no deterioration in a process for a wafer W even when the etching liquid is repeatedly used in the etching step. Moreover, formation of particles and watermarks on the surface of the wafer after it is dried W can be prevented.

In addition, the structure of the humidity adjusting mechanism 16 is not limited to the above-described one that adjusts a humidity by using a clean air supplied from the FFU 102 and a CDA supplied form the CDA supply source 104. For example, there may be disposed a moisture adjuster capable of adjusting a moisture content in a humidity adjusting gas to a given value, or a dehumidifier that dehumidifies a humidity adjusting gas. In this case, by introducing a humidity adjusting gas whose moisture content has been adjusted into the processing space S to replace atmospheres in the processing space S, a humidity of the processing space S can be adjusted to a given value.

Further, a gaseous body used as a humidity adjusting gas is not limited to an air (clean air, CDA). For example, in place of a clean air, another gas may be used, and in place of a CDA, another low dew-point gas may be used. For example, an inert gas such as a nitrogen gas may be possible.

Furthermore, a purified inert gas (having a general dew-point temperature) and a purified inert gas having a low dew point may be selectively supplied as humidity adjusting gases. In the above embodiment, the clean air and the CDA which are of the same kind of gaseous body (air) are used. However, gaseous bodies of different kinds and having different dew-point temperatures may be used as humidity adjusting gases. For example, a clean air supplied from the FFU may be used as a first humidity adjusting gas, and a nitrogen gas having a low dew point is used as a second humidity adjusting gas, in place of the CDA.

In addition to a liquid state, a fluid containing IPA to be supplied in the drying process may be in an atomized state, a mist state, a jet flow state, and a gaseous state. For example, a mist of IPA liquid, a mist of IPA solution, IPA vapor, or a vapor of IPA solution (mixed vapor in which IPA vapor and water vapor are mixed) may be used as a fluid containing IPA. In addition, a mixture of a gaseous body such as a nitrogen gas and a mist of IPA liquid, a mist of IPS solution, an IPA vapor, or a vapor of IPA solution may be used as the fluid containing IPA. Also in the case where such a fluid containing IPA is used, moisture can be prevented from being taken in IPA by decreasing a humidity of the processing space S. A binary fluid nozzle may be used as a nozzle for supplying the fluid containing IPA.

As a drying fluid for drying the surface of the wafer W, an organic solvent other than the fluid containing IPA may be used. To be specific, hydrofluoroether (HFE) may be used.

In the above embodiment, the etching process is described by way of an example for processing a wafer W with a process liquid. However, the same is true with a polymer removal process by means of a polymer removal liquid. That is to say, when a polymer removal liquid is used in place of an etching liquid to perform a polymer removal process in place of the etching process, even if the polymer removal liquid is repeatedly used in the polymer removal step, moisture in the polymer removal liquid is not prevented from being considerably evaporated. Thus, even when the polymer removal liquid is repeatedly used in the polymer removal step, deterioration in the process for a substrate to be processed can be prevented.

In this case, an amine-based chemical liquid is used as a polymer removal liquid. The amine-based chemical liquid is a liquid containing a component which is evaporated by a dried gas.

Further, in the above embodiment, there is illustrated the wafer-fed type substrate processing apparatus 1 that processes wafers W held by the spin chuck 3 one by one. However, this embodiment can be applied to a batch-type processing apparatus that collectively processes a plurality of wafers W. In addition, the substrate is not limited to a semiconductor wafer, and may be a glass for an LCD substrate, a CD substrate, a printed substrate, a ceramic substrate, and so on.

EXAMPLES

Next, a present example of the above-described substrate processing method is described. As a base of comparison, comparative examples 1 and 2 are described in which a CDA and a clean air are used for atmospheres in chambers, respectively, in all the processing steps including an etching step, a rinsing step, and a drying step, and so on.

Present Example

A substrate processing apparatus was prepared as shown in FIGS. 1 to 7. In the substrate processing apparatus 1, there were performed an etching step for a wafer W, a rinsing step, and a drying step. At first, a clean air having relatively a higher humidity was supplied from an FFU 102 into a chamber 2. Then, under the state that the chamber 2 was filed with the clean air, an HF liquid was supplied onto a surface of the wafer W in the chamber 2 so as to etch the surface of the wafer W. At this time, the HF liquid discharged from the chamber 2 was returned to an HF-liquid tank 43 through an HF-liquid collecting line 29. Thereafter, a CDA having a low humidity is supplied from a CDA supply source 104 into the chamber 2 to replace the atmosphere in the chamber from the clean air to the CDA, so that a humidity of the processing space S was largely decreased. After that, the rising process was performed by supplying a deionized water onto the surface of the wafer W which was being rotated. Then, under the state that the chamber 2 was filled with the CDA, an IPA liquid was supplied onto the surface of the wafer W while it was being rotated to form a liquid film on the surface of the wafer W. Subsequently, while continuing the rotation of the wafer W, the surface of the wafer W was dried by supplying an IPA liquid and a nitrogen gas onto the surface of the wafer W.

In accordance with the above method, the wafers W were subjected to the etching process one by one. Table 1 shows etching rates [A/min] of the 1st wafer W, the 25th wafer W, the 50th wafer W, and the 75th wafer W, which were thus processed.

TABLE 1

| wafer | etching rate [A/min] |
|---|---|
| 1st wafer | 37.0 |
| 25th wafer | 37.1 |
| 50th wafer | 37.5 |
| 75th wafer | 37.7 |

According to the present example, the etching rate of the 1st wafer W was 37.0 A/min, and the etching rate of the 75th wafer was 37.7 A/min. Namely, increase in the etching rate was 0.7 A/min. There was no particles or watermarks formed on the surfaces of the wafers W after they were dried.

Comparative Example 1

Also in the comparative example 1, a substrate processing apparatus 1 as shown in FIGS. 1 to 7 was prepared. In the substrate processing apparatus, there were performed an etching step for a wafer W, a rinsing step, and a drying step. Throughout all the processing steps including the etching step, the rinsing step, and the drying step, an atmosphere in the chamber was CDA. Other than this, the wafers W were subjected to the same processes as those of the present example.

In accordance with the above method, the wafers W were subjected to the etching process one by one. Table 2 shows etching rates [A/min] of the 1st wafer W, the 25th wafer W, the 50th wafer W, and the 75th wafer W, which were thus processed.

TABLE 2

| wafer | etching rate [A/min] |
|---|---|
| 1st wafer | 37.8 |
| 25th wafer | 38.0 |
| 50th wafer | 38.6 |
| 75th wafer | 39.6 |

According to the comparative example 1, the etching rate of the 1st wafer W was 37.8 A/min, and the etching rate of the 75th wafer was 39.6 A/min. Namely, increase in the etching rate was 1.8 A/min which was larger than the increase in the etching rate of the present example. There was no particles or watermarks formed on the surfaces of the wafers W after they were dried.

Comparative Example 2

Also in the comparative example 2, a substrate processing apparatus 1 as shown in FIGS. 1 to 7 was prepared. In the substrate processing apparatus, there were performed an etching step for a wafer W, a rinsing step, and a drying step. Throughout all the processing steps including the etching step, the rinsing step, and the drying step, an atmosphere in the chamber was clean air. Other than this, the wafers W were subjected to the same processes as those of the present example.

In accordance with the above method, the wafers W were subjected to the etching process one by one. Table 3 shows etching rates [A/min] of the 1st wafer W, the 25th wafer W, the 50th wafer W, and the 75th wafer W, which were thus processed.

TABLE 2

| wafer | etching rate [A/min] |
|---|---|
| 1st wafer | 37.0 |
| 25th wafer | 36.9 |
| 50th wafer | 37.2 |
| 75th wafer | 37.3 |

According to the comparative example 2, the etching rate of the 1st wafer W was 37.0 A/min, and the etching rate of the 75th wafer was 37.3 A/min. Namely, increase in the etching rate was 0.3 A/min. However, particles and watermarks were formed on surfaces of the certain wafers, and thus there was a possibility that a desired wafer W could not be obtained.

[Experiment Result]

As described above, in the case where the etching process was performed under the state that the chamber 2 was filled with the clean air, and then the drying process was performed after the atmosphere in the chamber 2 was replaced from the clean air to the CDA, even when the etching liquid was repeatedly used, it was found that there was no tendency that an etching rate of the wafer W was increased, and further that formation of particles and watermarks on the surface of the dried wafer W could be prevented.

On the other hand, in the cases where the atmospheres in the chambers 2 were the CDA and the clean air, respectively, throughout all the processing steps including the etching step, the rinsing step, and the drying step, it was found that a processing property for the wafer W in both cases was inferior to the present exampled.

The invention claimed is:

1. A substrate processing apparatus comprising:
a processing chamber for housing a substrate to be processed;
a process-liquid supplying part for supplying a process liquid into the processing chamber;
a drying-fluid supplying part for supplying a drying fluid into the processing chamber;
a process-liquid collecting line for collecting the process liquid discharged from the processing chamber and returning the same to the process-liquid supplying part;
a first-gas supplying part and a second-gas supplying part for supplying into the processing chamber a first gas and a second gas whose humidity is lower than that of the first gas, respectively;
a gas flow switching device that adjusts the flow of the first gas being supplied by the first-gas supplying part into the processing chamber and the flow of the second gas being supplied by the second-gas supplying part into the processing chamber; and
a means for controlling the process-liquid supplying part, the drying-fluid supplying part, and the gas flow switching device;
wherein the means for controlling controls the process-liquid supplying part, the drying-fluid supply part, and the gas flow switching device, such that a first gas is supplied from the first-gas supplying part into the processing chamber to fill the same with the first gas in order to prevent the moisture in a process liquid to be supplied into the processing chamber from being evaporated, and the process liquid is supplied, with the processing chamber being filled with the first gas, from the process-liquid supplying part onto a surface of a substrate to be processed in the processing chamber so as to process the surface of the substrate to be processed, while the process liquid discharged from the processing chamber is returned to the process-liquid supplying part by the process-liquid collecting line, and thereafter the means for controlling controls a position of the gas flow switching device, such that the gas flow switching device lessens the flow of the first gas being supplied by the first-gas supplying part into the processing chamber and increases the flow of the second gas being supplied by the second-gas supplying part into the processing chamber to fill the processing chamber with the second gas, which second gas is of lower humidity than the first gas, and a drying fluid is supplied, with the processing chamber being filled with the second gas, from the drying-fluid supplying part onto the surface of the substrate in the processing chamber so as to dry the surface of the substrate.

* * * * *